US010622416B2

(12) United States Patent
Park et al.

(10) Patent No.: US 10,622,416 B2
(45) Date of Patent: Apr. 14, 2020

(54) TRANSPARENT DISPLAY DEVICE AND METHOD FOR FABRICATING THE SAME

(71) Applicant: LG DISPLAY CO., LTD., Seoul (KR)

(72) Inventors: Sunyoung Park, Paju-si (KR); Jae-Hyun Kim, Seoul (KR); Pureum Kim, Incheon (KR); Kihan Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 35 days.

(21) Appl. No.: 15/367,821

(22) Filed: Dec. 2, 2016

(65) Prior Publication Data
US 2017/0162636 A1    Jun. 8, 2017

(30) Foreign Application Priority Data
Dec. 4, 2015 (KR) .................. 10-2015-0171899

(51) Int. Cl.
*H01L 27/32* (2006.01)
*G02F 1/1333* (2006.01)
(Continued)

(52) U.S. Cl.
CPC ........ *H01L 27/3232* (2013.01); *G02F 1/1337* (2013.01); *G02F 1/1368* (2013.01);
(Continued)

(58) Field of Classification Search
CPC ........... H01L 27/3232; G02F 1/133555; G02F 2203/09; G02F 1/134363
See application file for complete search history.

(56) References Cited

U.S. PATENT DOCUMENTS

2007/0069995 A1* 3/2007 Shin .................. H01L 27/3232
345/76
2008/0117496 A1* 5/2008 Park .................. G02F 1/133512
359/296
(Continued)

FOREIGN PATENT DOCUMENTS

CN        1928671 A     3/2007
CN      1022629583 A    8/2012
(Continued)

*Primary Examiner* — Michael H Caley
*Assistant Examiner* — Jonathan Y Jung
(74) *Attorney, Agent, or Firm* — Birch, Stewart, Kolasch & Birch, LLP

(57) ABSTRACT

A transparent display device that may improve light transmittance in a transmissive mode, and a method for fabricating the same are discussed. The transparent display device according to an embodiment includes a first substrate, a second substrate facing a first surface of the first substrate, and a third substrate facing a second surface of the first substrate; a display unit arranged between the first and third substrates, and including a transmissive area and an emission area; and a light controller arranged between the first and second substrates, and transmitting or shielding incident light. The light controller includes a control thin film transistor provided on the first surface of the first substrate; a first electrode provided on the control thin film transistor; a second electrode provided on one surface of the second substrate facing the first substrate; and liquid crystal cells arranged between the first electrode and the second electrode. The control thin film transistor is arranged to correspond to the emission area.

10 Claims, 11 Drawing Sheets

(51) Int. Cl.

| | |
|---|---|
| *G02F 1/1343* | (2006.01) |
| *G02F 1/1368* | (2006.01) |
| *G09G 3/3208* | (2016.01) |
| *G09G 3/34* | (2006.01) |
| *G09G 3/36* | (2006.01) |
| *G09G 3/3258* | (2016.01) |
| *G02F 1/1337* | (2006.01) |
| G02F 1/1335 | (2006.01) |
| G02F 1/1362 | (2006.01) |
| G09G 3/3266 | (2016.01) |
| G09G 3/3275 | (2016.01) |

(52) U.S. Cl.
CPC .... *G02F 1/13439* (2013.01); *G02F 1/133377* (2013.01); *G02F 1/134309* (2013.01); *H01L 27/3262* (2013.01); *G02F 1/133305* (2013.01); *G02F 1/133504* (2013.01); *G02F 1/136286* (2013.01); *G02F 2001/133742* (2013.01); *G02F 2202/28* (2013.01); *G09G 3/3208* (2013.01); *G09G 3/3258* (2013.01); *G09G 3/3266* (2013.01); *G09G 3/3275* (2013.01); *G09G 3/3406* (2013.01); *G09G 3/36* (2013.01); *G09G 3/3677* (2013.01); *G09G 3/3688* (2013.01); *G09G 2310/08* (2013.01); *G09G 2320/0626* (2013.01); *G09G 2330/021* (2013.01); *G09G 2380/02* (2013.01)

(56) References Cited

U.S. PATENT DOCUMENTS

| | | | |
|---|---|---|---|
| 2008/0272375 A1* | 11/2008 | Oh | G02F 1/13471 257/72 |
| 2010/0091208 A1* | 4/2010 | Kramer | G02F 1/1391 349/33 |
| 2013/0155340 A1 | 6/2013 | Clapp et al. | |
| 2013/0194167 A1 | 8/2013 | Yun et al. | |
| 2013/0215346 A1* | 8/2013 | Lee | C09K 19/52 349/42 |
| 2014/0185129 A1* | 7/2014 | Kim | H01L 51/5284 359/296 |

FOREIGN PATENT DOCUMENTS

| | | |
|---|---|---|
| CN | 102959049 A | 3/2013 |
| CN | 103226929 A | 7/2013 |

* cited by examiner

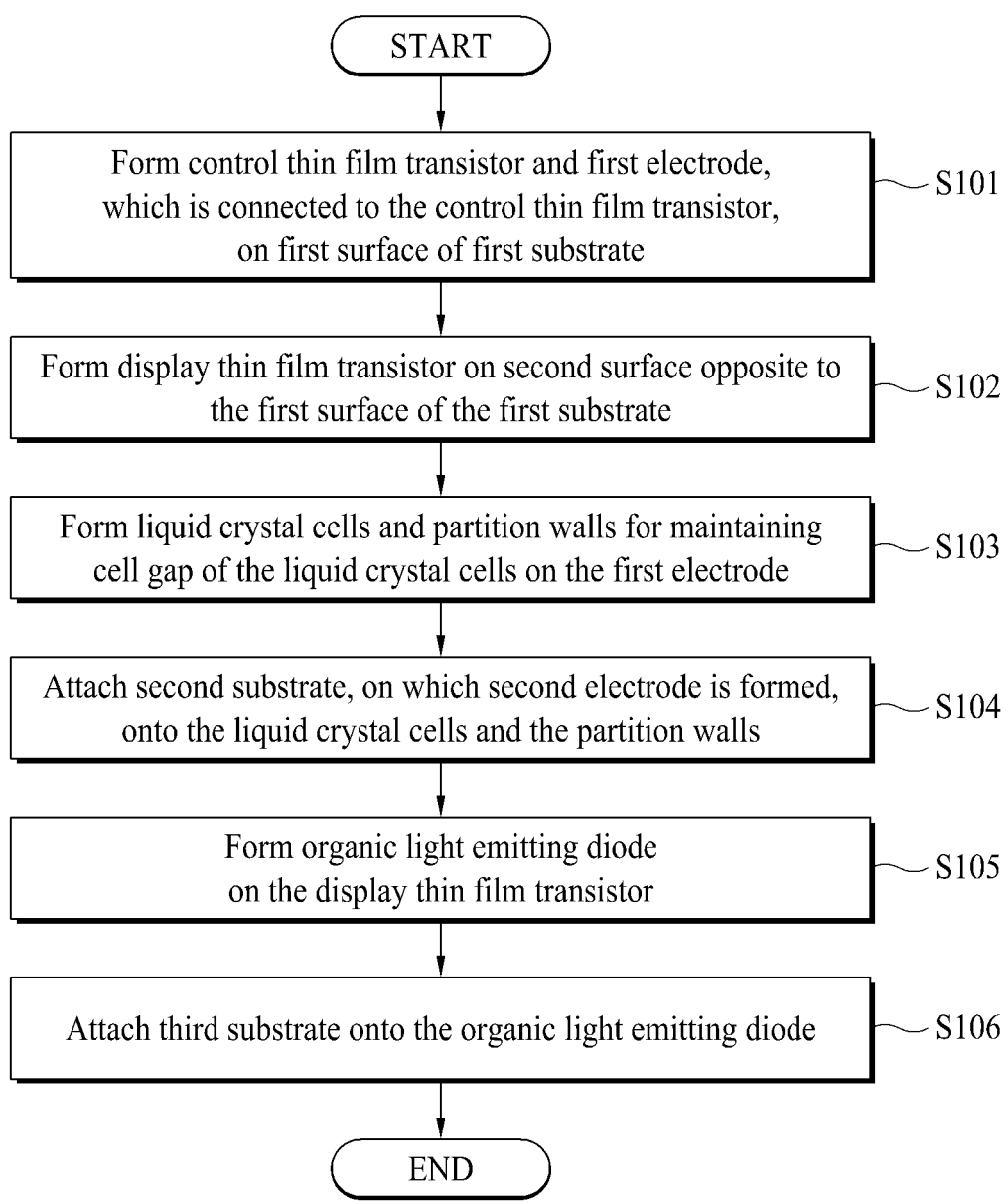

TRANSPARENT DISPLAY DEVICE AND METHOD FOR FABRICATING THE SAME

CROSS REFERENCE TO RELATED APPLICATIONS

This application claims the priority benefit of the Korean Patent Application No. 10-2015-0171899 filed on Dec. 4, 2015, which is hereby incorporated by reference for all purposes as if fully set forth herein.

BACKGROUND OF THE INVENTION

Field of the Invention

The present invention relates to a transparent display device and a method for fabricating the same.

Discussion of the Related Art

Recently, with the advancement of the information age, display devices for processing and displaying a large amount of information have been promptly developed. More particularly, various display devices have been introduced and spotlighted. Detailed examples of the display devices include liquid crystal display (LCD) devices, plasma display panel (PDP) devices, field emission display (FED) devices, electroluminescence display (ELD) devices, and organic electroluminescent display (OLED) devices.

Recently, the display devices have excellent properties of a thin profile, light weight and low power consumption and thus their application fields have been increased continuously. In particular, in most of electron devices or mobile devices, the display device has been used as one of user interfaces.

Also, studies of a transparent display device through which a user may see objects or images disposed on a rear surface of the display device have been actively made. The transparent display device may have advantages of better use of space, interior and design, and may have various application fields. The transparent display device may solve spatial and temporal restrictions of the existing electron devices by realizing functions of information recognition, information processing and information display as a transparent electron device. For example, the transparent display device may be applied to a window of a building or a car, and thus may be used as a smart window that allows a background to be seen or displays an image.

The transparent display device may be realized as an organic light emitting display device that includes a transmissive area transmitting light and an emission area displaying an image. In this case, the transparent display device has an advantage of low power consumption. However, although the transparent display device has no problem in a contrast ratio under a dark environment, a problem occurs in that a contrast ratio is deteriorated under an environment that light exists. A contrast ratio of a dark environment may be defined as a dark room contrast ratio while a contrast ratio of an environment that light exists may be defined as a bright room contrast ratio. That is, since the transparent display device includes a transmissive area to allow a user to view an object or background disposed on a rear surface, a problem occurs in that a bright room contrast ratio is deteriorated. Therefore, if the transparent display device is realized as the organic light emitting display device, a light controlling device, which includes a light shielding mode shielding light and a transmissive mode transmitting light, is required to prevent a bright contrast ratio from being deteriorated.

The light controlling device may include a first substrate, a second substrate, a liquid crystal layer of a liquid state arranged between the first substrate and the second substrate, and partition walls for uniformly maintaining a gap of the liquid crystal layer. The light controlling device is bonded to a transparent display panel provided in a transparent display device by using a transparent adhesive film such as an optically clear adhesive (OCA) or a transparent adhesive such as an optically clear adhesive (OCA). To enhance transmittance in a transmissive mode of the transparent display device, it is preferable that the liquid crystal layer of the light controlling device is aligned in the transmissive area of the transparent display device. However, if the transparent display device and the light controlling device are not aligned normally during a bonding process of the transparent display device and the light controlling device, light transmittance in the transmissive mode may be deteriorated.

SUMMARY OF THE INVENTION

Accordingly, the present invention is directed to a transparent display device and a method for fabricating the same, which substantially obviate one or more problems due to limitations and disadvantages of the related art.

An advantage of the present invention is to provide a transparent display device that may improve light transmittance in a transmissive mode, and a method for fabricating the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a transparent display device according to an embodiment of the present invention comprises a first substrate, a second substrate facing a first surface of the first substrate, and a third substrate facing a second surface of the first substrate; a display unit arranged between the first and third substrates, and including a transmissive area and an emission area; and a light controller arranged between the first and second substrates, and transmitting or shielding incident light. The light controller includes a control thin film transistor provided on the first surface of the first substrate; a first electrode provided on the control thin film transistor; a second electrode provided on one surface of the second substrate facing the first substrate; and liquid crystal cells arranged between the first electrode and the second electrode, and the control thin film transistor is arranged to correspond to the emission area.

In another aspect of the present invention, a method for fabricating a transparent display device according to an embodiment of the present invention comprises forming a control thin film transistor and a first electrode, which is connected to the control thin film transistor, on a first surface of a first substrate; forming a display thin film transistor on a second surface opposite to the first surface of the first substrate; forming liquid crystal cells and partition walls for maintaining a cell gap of the liquid crystal cells on the first electrode; attaching a second substrate, on which a second electrode is formed, onto the liquid crystal cells and the partition walls; forming an organic light emitting diode on the display thin film transistor; and attaching a third substrate onto the organic light emitting diode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 7 is a flow chart illustrating a method for fabricating a transparent display device according to an embodiment of the present invention.

DETAILED DESCRIPTION OF THE INVENTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a transparent display device and a method for fabricating the same according to the present invention will be described in detail with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted or may be brief.

Figure 1:
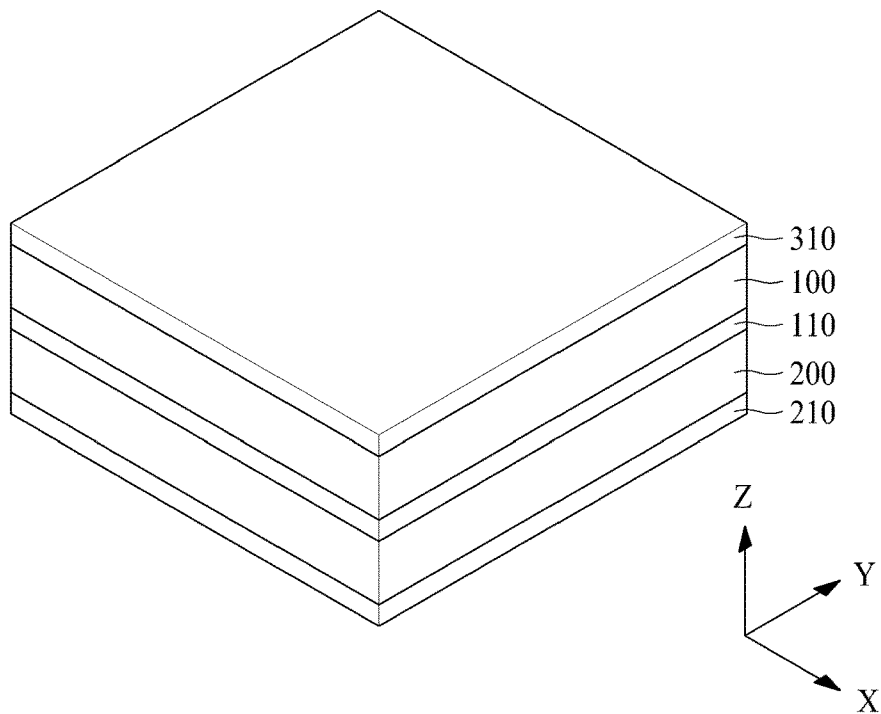
FIG. 1 is a perspective view illustrating a transparent display device according to an embodiment of the present invention.
Figure 2:
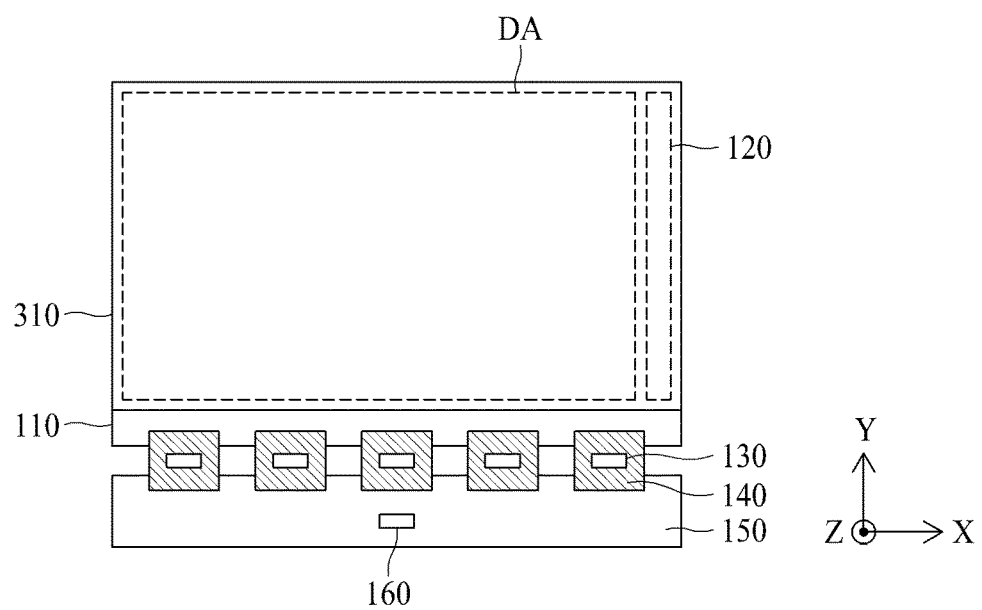
FIG. 2 is a plane view illustrating a display unit, a display gate driver, a display source drive IC, a display flexible film, a display circuit board and a display timing controller of the transparent display device according to the embodiment of the present invention.
Figure 3:
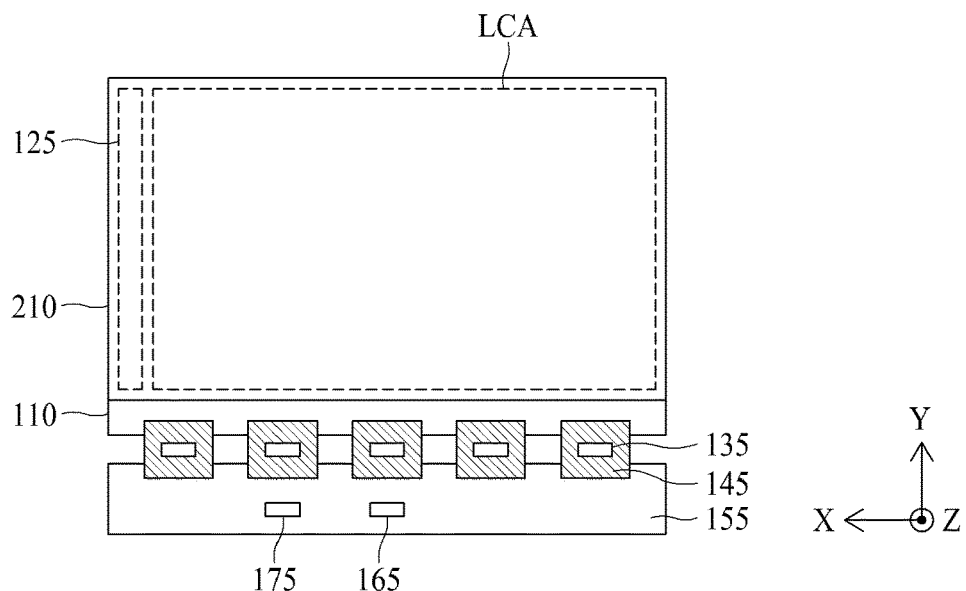
FIG. 3 is a plane view illustrating a controller, a control gate driver, a control source drive IC, a control flexible film, a control circuit board and a control timing controller of the transparent display device according to the embodiment of the present invention.
Figure 4:
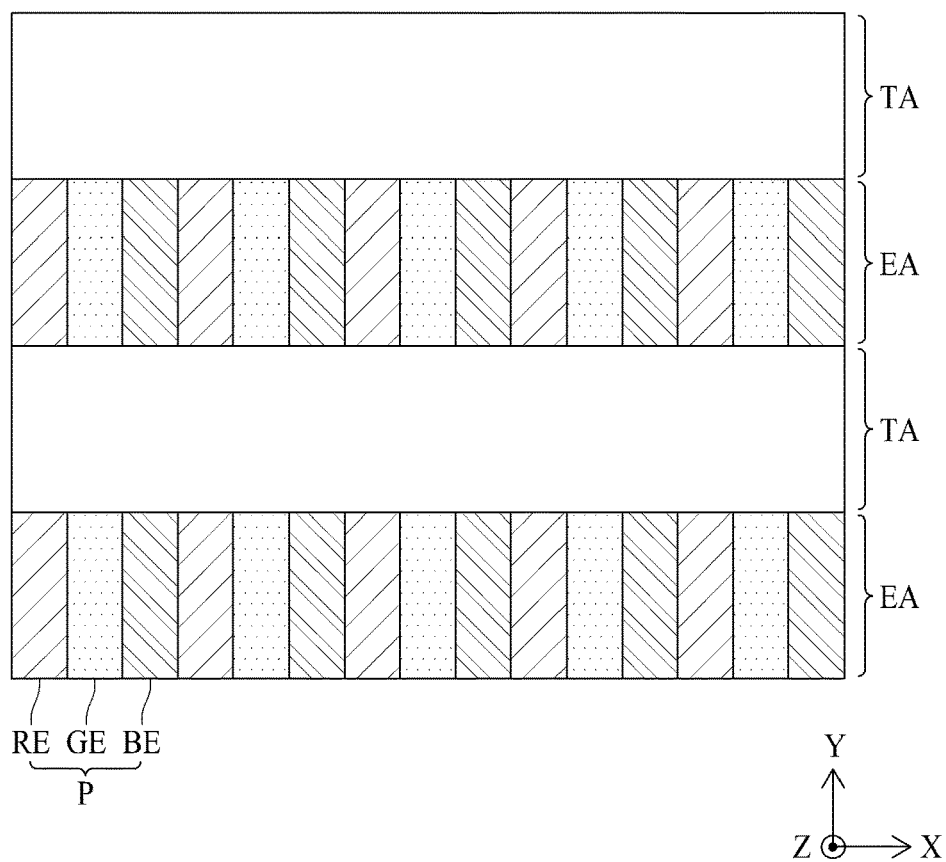
FIG. 4 is an exemplary view illustrating a transmissive area and an emission area of a display area in FIG. 2.

FIG. 1 is a perspective view illustrating a transparent display device according to an embodiment of the present invention. FIG. 2 is a plane view illustrating a display unit, a display gate driver, a display source drive IC, a display flexible film, a display circuit board and a display timing controller of the transparent display device according to the embodiment of the present invention. FIG. 3 is a plane view illustrating a controller, a control gate driver, a control source drive IC, a control flexible film, a control circuit board and a control timing controller of the transparent display device according to the embodiment of the present invention. FIG. 4 is an exemplary view illustrating a transmissive area and an emission area of a display area in FIG. 2. All the components of the transparent display device according to all embodiments of the present invention are operatively coupled and configured.

Hereinafter, the transparent display device according to the embodiment of the present invention will be described in detail with reference to FIGS. 1 to 4. In FIGS. 1 to 4, X-axis indicates a direction parallel with a gate line, Y-axis indicates a direction parallel with a data line, and Z-axis indicates a height direction of the transparent display device.

Referring to FIGS. 1 to 4, the transparent display device according to the embodiment of the present invention includes a first substrate 110, a second substrate 210, a third substrate 310, a display unit 100, a display gate driver 120, a display source drive integrated circuit (hereinafter, referred to as "IC") 130, a display flexible film 140, a display circuit board 150, and a display timing controller 160. Also, the transparent display device according to the embodiment of the present invention includes a light controller 200, a control gate driver 125, a control source drive IC 135, a control flexible film 145, a control circuit board 155, a control timing controller 165, and a common voltage supply unit 175.

Although the transparent display device according to the embodiment of the present invention has been described based on an organic light emitting display device, the transparent display device may be realized as a liquid crystal display device or an electrophoresis display device.

The display unit 100 is provided on a second surface of the first substrate 110, and the third substrate 310 is provided on the display unit 100. The light controller 200 is provided on a first surface of the first substrate 110, and the second substrate 210 is provided on the light controller 200. The first substrate 110 may be, but not limited to, a transparent glass substrate.

The second substrate 210 is arranged to face the first surface of the first substrate 110. The second substrate 210 may be formed to be smaller than the first substrate 110, whereby the first surface of the first substrate 110 may partially be exposed without being covered by the second substrate 210. The second substrate 210 may be a plastic film. For example, the second substrate 210 may be, but not limited to, a sheet or film that includes cellulose resin such as TAC(triacetyl cellulose) or DAC(diacetyl cellulose), COP (cyclic olefin polymer) such as Norbornene derivatives, acryl resin such as PMMA(poly(methylmethacrylate)), polyolefin such as PC(polycarbonate), PE(polyethylene) or PP(polypropylene), polyester such as PVA(polyvinyl alcohol), PES(poly ether sulfone), PEEK(polyetheretherketone), PEI(polyetherimide), PEN(polyethylenenaphthalate), and PET(polyethyleneterephthalate), PI(polyimide), PSF(polysulfone), or fluoride resin.

The third substrate 310 is arranged to face the second surface of the first substrate 110. The third substrate 310 may be an encapsulation substrate. The third substrate 310 may be formed to be smaller than the first substrate 110, whereby the second surface of the first substrate 110 may partially be exposed without being covered by the third substrate 310.

The display unit 100 is provided on the second surface of the first substrate 110. The display unit 100 is arranged between the first substrate 110 and the third substrate 310. Display gate lines and display data lines may be formed in a display area DA of the display unit 100, and emission portions may be formed in areas where the display gate lines cross the display data lines. The emission portions of the display area DA may display an image.

The display area DA includes transmissive areas TA and emission areas EA as shown in FIG. 4. The display unit 100 may allow a user to view an object or background disposed on a rear surface due to the transmissive areas TA, and may display images due to the emission areas EA. The transmissive areas TA and the emission areas EA are formed longitudinally along the gate lines (X-axis direction) in FIG. 4, but are not limited to FIG. 4. That is, the transmissive areas TA and the emission areas EA may be formed longitudinally along the data lines (Y-axis direction).

The transmissive area TA is an area that transmits incident light as it is. The emission area EA is an area that emits light. The emission area EA may include a plurality of pixels P, each of which includes a red emission portion RE, a green emission portion GE, and a blue emission portion BE as shown in FIG. 4, but is not limited to FIG. 4. For example, each of the pixels P may further include a white emission portion in addition to the red emission portion RE, the green emission portion GE and the blue emission portion BE. Alternatively, each of the pixels P may include at least two emission portions of a red emission portion RE, a green emission portion GE, a blue emission portion BE, a yellow emission portion, a magenta emission portion, and a cyan emission portion.

The red emission portion RE is an area that emits red light, the green emission portion GE is an area that emits green light, and the blue emission portion BE is an area that emits blue light. The red emission portion RE, the green emission portion GE and the blue emission BE portion of the emission area EA correspond to non-transmissive areas that emit predetermined light and do not transmit incident light. A detailed description of the display unit 100 will be made later with reference to FIG. 5.

As described above, each of the pixels P of the transparent display device according to the embodiment of the present invention includes the transmissive areas TA that transmit incident light as it is, and emission areas EA that emit light. As a result, according to the embodiment of the present invention, a user may view an object or background disposed on the rear surface of the transparent display device through the transmissive areas TA of the transparent display device.

The display gate driver 120 supplies gate signals to the gate lines in accordance with a gate control signal input from the display timing controller 160. In FIG. 2, the gate driver 120 is formed, but not limited to, outside one side of the display area DA in a gate driver in panel (GIP) mode. That is, the display gate driver 120 may be formed outside both sides of the display area DA in a GIP mode, or may be fabricated of a driving chip, packaged in a flexible film and attached to the second surface of the first substrate 110 in a tape automated bonding (TAB) mode.

The display source drive IC 130 receives digital video data and a source control signal from the display timing controller 160. The display source drive IC 130 converts the digital video data to analog data voltages in accordance with the source control signal and supplies the analog data voltages to the data lines. If the display source drive IC 130 is fabricated of a driving chip, the display source drive IC may be packaged in the display flexible film 140 in a chip on film (COF) or chip on plastic (COP) mode.

Since the third substrate 310 is smaller than the first substrate 110, the first substrate 110 may partially be exposed without being covered by the third substrate 310. Pads such as data pads are provided in the first substrate 110 which is exposed without being covered by the third substrate 310. Lines which connect the pads with the display source drive IC 130 and lines which connect the pads with lines of the display circuit board 150 may be formed in the display flexible film 140. An anisotropic conducting film may be used as the display flexible film 140, and is attached onto the pads, whereby the pads may be connected with the lines of the display flexible film 140.

The display circuit board 150 may be attached to the display flexible films 140. A plurality of circuits comprised of driving chips may be packaged in the display circuit board 150. For example, the display timing controller 160 may be packaged in the display circuit board 150. The display circuit board 150 may be a printed circuit board or a flexible printed circuit board.

The display timing controller 160 receives digital video data and a timing signal from an external system board. The display timing controller 160 generates a gate control signal for controlling an operation timing of the display gate driver 120 and a source control signal for controlling the display source drive ICs 130 on the basis of the timing signal. The display timing controller 160 supplies the gate control signal to the display gate driver 120, and supplies the source control signal to the display source drive ICs 130.

The light controller 200 is provided on the first surface of the first substrate 110. The light controller 200 shields incident light in a light-shielding mode and transmits incident light in a transmissive mode. The light controller 200 shields most of light in the light-shielding mode, and for example, may be designed such that an output light-to-incident light ratio (hereinafter, referred to as "light transmittance") reaches α% or less. Also, the light controller 200 transmits most of light in the transmissive mode, and for example, may be designed such that light transmittance reaches β % or more. At this time, β is greater than a. The light controller 200 according to the embodiment of the present invention may realize the light-shielding mode and the transmissive mode by using a liquid crystal layer to which a dynamic scattering mode is applied.

A light controlling area (LCA) of the light controller 200 is provided at a position corresponding to the display area DA. Control gate lines and control data lines may be formed in the light controlling area LCA, and a control thin film transistor may be formed in areas where the control gate lines cross the control data lines. In this case, the control thin film transistor is provided at a position corresponding to the emission area EA of the display area. A detailed description of the light controller 200 will be made later with reference to FIG. 5.

The control gate driver 125 supplies gate signals to the control gate lines in accordance with a gate control signal input from the control timing controller 165. The control gate driver 125 is provided at a position corresponding to the display gate driver 120. In FIG. 3, the control gate driver 125 is formed, but not limited to, outside one side of the light controlling area LCA in a gate driver in panel (GIP) mode. That is, the control gate driver 125 may be fabricated of a driving chip, packaged in a flexible film and attached to the first surface of the first substrate 110 in a tape automated bonding (TAB) mode.

The control source drive IC 135 receives control data and a source control signal from the control timing controller 165. The control source drive IC 135 converts the control data to driving voltages in accordance with the source control signal and supplies the driving voltages to the control data lines. If the control source drive IC 135 is fabricated of a driving chip, the control source drive IC may be packaged in the control flexible film 145 in a chip on film (COF) or chip on plastic (COP) mode.

The common voltage supply unit 175 supplies a common voltage to a second electrode. The common voltage supply unit 175 applies the common voltage to the second electrode provided on the second substrate 210. The common voltage supply unit 175 may be packaged in the control circuit board 155. If a driving voltage is applied to a first electrode of the light controller 200 and the common voltage is applied to the second electrode, liquid crystals and dichroic dyes of the liquid crystal layer are randomly moved by ion materials. In this case, since light incident on the liquid crystal layer 250 may be scattered by the randomly moved liquid crystals or may be absorbed by the dichroic dyes, the light-shielding mode may be realized.

Since the second substrate 210 is smaller than the first substrate 110, the first substrate 110 may partially be exposed without being covered by the second substrate 210. Control pads are provided partially on the first surface of the first substrate 110 which is exposed without being covered by the second substrate 210. Lines which connect the control pads with the control source drive IC 135 and lines which connect the control pads with lines of the control circuit board 155 may be formed in the control flexible film 145. An anisotropic conducting film may be used as the control flexible film 145, and is attached onto the control pads, whereby the control pads may be connected with the lines of the control flexible film 145.

The control circuit board 155 may be attached to the control flexible films 145. A plurality of circuits comprised of driving chips may be packaged in the control circuit board 155. For example, the control timing controller 165 may be packaged in the control circuit board 155.

The control timing controller 165 receives digital video data and a timing signal from an external system board. The control timing controller 165 generates a gate control signal for controlling an operation timing of the control gate driver 125 and a source control signal for controlling the control source drive ICs 135 on the basis of the control timing signal. The control timing controller 165 supplies the gate control signal to the control gate driver 125, and supplies the source control signal to the control source drive ICs 135. In the embodiment of the present invention, the display source drive IC 130, the display flexible circuit film 140, the display circuit board 150, the display timing controller 160, the control source drive IC 135, the control flexible circuit film 145, the control circuit board 155 and the control timing controller 165 are provided at one side of the first substrate 110 as an example, but are not limited to one side of the first substrate. That is, the display source drive IC 130, the display flexible circuit film 140, the display circuit board 150 and the display timing controller 160 may be provided at one side of the first substrate 110, and the control source drive IC 135, the control flexible circuit film 145, the control circuit board 155 and the control timing controller 165 may be provided at the other side of the first substrate 110.

In the transparent display device according to the embodiment of the present invention as described above, since the light controller 200 is provided on the first surface of the first substrate 110 and the display unit 100 is provided on the second surface of the first substrate 110, a bonding process may be omitted and one substrate may also be omitted as compared with the related art in which the light controller and the transparent display panel are respectively fabricated and then bonded to each other. Therefore, light transmittance in the transmissive mode of the transparent display device may be improved, and the fabricating cost may be reduced.

Figure 5:
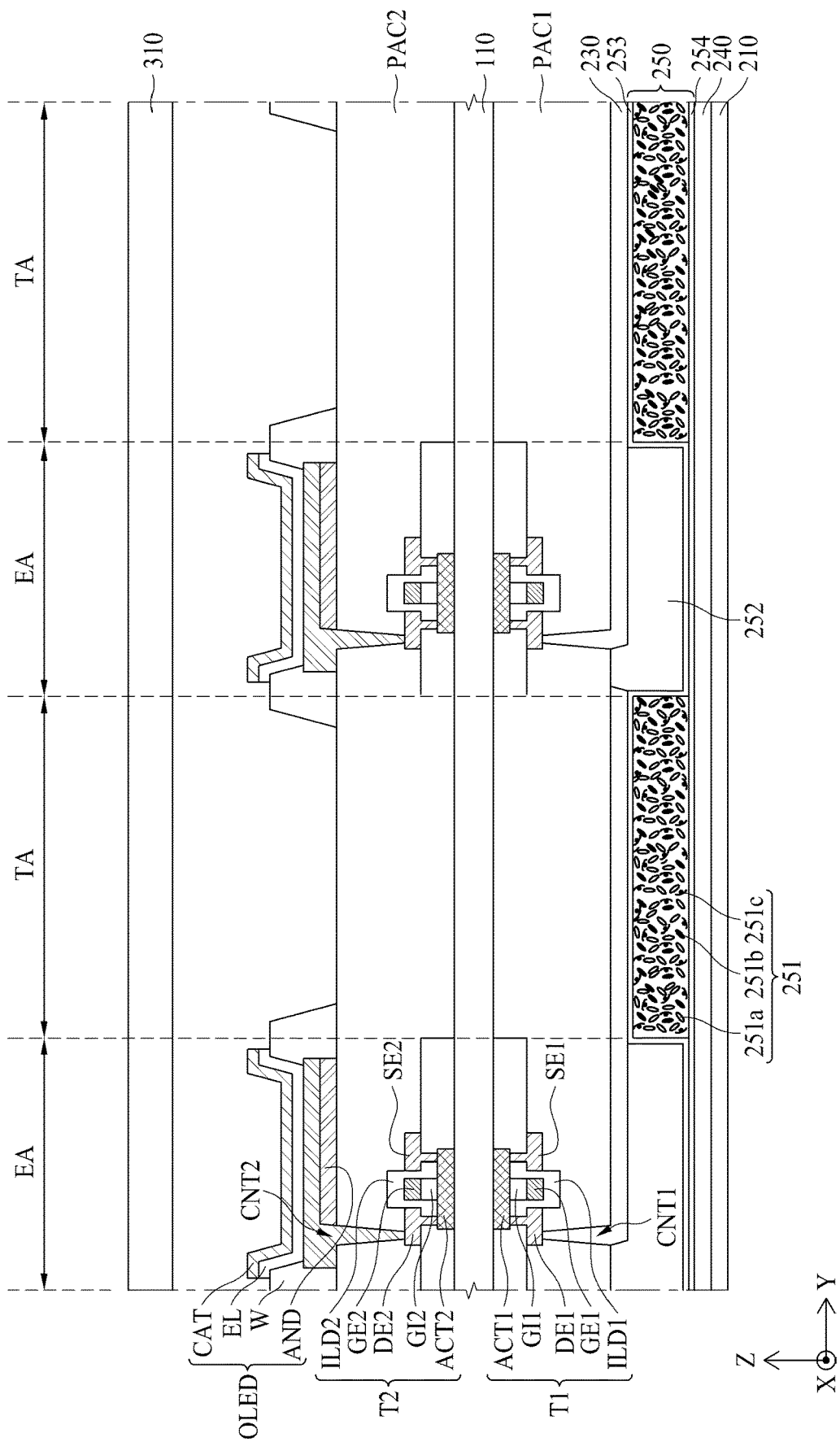
FIG. 5 is a cross-sectional view illustrating one side section of a transparent display device according to an embodiment of the present invention.

FIG. 5 is a cross-sectional view illustrating one side section of a transparent display device according to the embodiment of the present invention.

Referring to FIG. 5, the transparent display device according to the embodiment of the present invention includes a display unit 100 and a light controller 200. The display unit 100 is provided on the second surface of the first substrate 110. The display unit 100 includes a display thin film transistor T2 and an organic light emitting diode (OLED).

The display thin film transistor T2 is provided on the emission area EA and arranged to correspond to the control thin film transistor T1. The display thin film transistor T2 includes a display active layer ACT2 provided on the second surface of the first substrate 110, a display gate insulator GI2 provided on the display active layer ACT2, a display gate electrode GE2 provided on the display gate insulator GI2, a display inter layer dielectric ILD2 provided on the display gate electrode GE2, display source and drain electrodes SE2 and DE2 provided on the display inter layer dielectric ILD2 and connected to the display active layer ACT2. Although the display thin film transistor T2 is formed in a top gate type in FIG. 5, the display thin film transistor T2 may be formed in a bottom gate type without limitation to the top gate type, wherein the bottom gate type indicates that the display gate electrode GE2 is arranged below the display active layer ACT2. A display planarization layer PAC2 for planarizing the second surface of the first substrate 110 provided with the display thin film transistor T2 is provided on the display thin film transistor T2.

The organic light emitting diode OLED includes an anode electrode AND, an organic layer EL, and a cathode electrode CAT. The anode electrode AND is connected to the display drain electrode DE2 through a display contact hole CNT2 that passes through the display inter layer dielectric ILD2 and the display planarization layer PAC2. A bank W is provided between the anode electrodes AND adjacent to each other, whereby the anode electrodes AND adjacent to each other may electrically be insulated from each other.

The organic layer EL is provided on the anode electrode AND. The organic layer EL may include a hole transporting layer, an organic light emitting layer, and an electrode transporting layer. The cathode electrode CAT is provided on the organic layer EL and the bank W. If a voltage is applied to the anode electrode AND and the cathode electrode CAT, holes and electrons are respectively moved to the organic light emitting layer through the hole transporting layer and the electron transporting layer and combined with each other in the organic light emitting layer to emit light.

Although the display unit 100 is formed in a top emission type in the embodiment of the present invention, the display unit 100 may be formed in a bottom emission type without limitation to the top emission type. In the top emission type, since light of the organic layer EL is emitted toward the upper substrate, the display thin film transistor T2 may be provided in a wide range below the bank W and the anode electrode AND. Therefore, the top emission type has an advantage in that a design area of the display thin film transistor T2 is wider than that of the bottom emission type. Also, in the top emission type, the anode electrode AND is preferably formed of, but not limited to, a metal material having high reflexibility such as aluminum and a deposition structure of aluminum and ITO, and the cathode electrode CAT is preferably formed of, but not limited to, a transparent metal material such as ITO and IZO. The cathode electrode CAT may be any one of Ag, Ti, Al, Mo, or an alloy of Ag and Mg, which is thinly formed at a thickness of several hundreds of A or less. In this case, the cathode electrode CAT may be a semi-transmissive layer, and therefore may be used as a substantially transparent cathode.

The light controller 200 includes a control thin film transistor T1, a first electrode 230, a second electrode 240, and a liquid crystal layer 250. The control thin film transistor T1 is arranged to correspond to the emission area EA. The control thin film transistor T1 includes a control active layer ACT1 provided on the first surface of the first substrate 110, a control gate insulator GI1 provided on the control active layer ACT1, a control gate electrode GE1 provided on the control gate insulator GI1, a control inter layer dielectric ILD1 provided on the control gate electrode GE1, control source and drain electrodes SE1 and DE1 provided on the control inter layer dielectric ILD1 and connected to the control active layer ACT1. Although the control thin film transistor T1 is formed in a top gate type in FIG. 5, the control thin film transistor T1 may be formed in a bottom gate type without limitation to the top gate type, wherein the bottom gate type indicates that the control gate electrode GE1 is arranged below the control active layer ACT1. A control planarization layer PAC1 for planarizing the first surface of the first substrate 110 provided with the control thin film transistor T1 is provided on the control thin film transistor T1.

The first electrode 230 is provided on the first surface of the first substrate 110 facing the second substrate 210. The first electrode 230 is provided on the control thin film transistor T1 and connected with the control drain electrode DE1 of the control thin film transistor T1 through a control contact hole CNT1 provided on the control planarization layer PAC1. The second electrode 240 is provided on one surface of the second substrate 210 facing the first substrate 110. Each of the first and second electrodes 230 and 240 may be a transparent electrode. For example, each of the first and second electrodes 230 and 240 may be, but not limited to, silver oxide (e.g.; AgO or $Ag_2O$ or $Ag_2O_3$), aluminum oxide (e.g.; $Al_2O_3$), tungsten oxide (e.g.; $WO_2$ or $WO_3$ or $W_2O_3$), magnesium oxide (e.g.; MgO), molybdenum (e.g.; $MoO_3$), zinc oxide (e.g.; ZnO), tin oxide (e.g.; $SnO_2$), indium oxide (e.g.; $In_2O_3$), chrome oxide (e.g.; $CrO_3$ or $Cr_2O_3$), antimony oxide (e.g.; $Sb_2O_3$ or $Sb_2O_5$), titanium oxide (e.g; $TiO_2$), nickel oxide (e.g.; NiO), copper oxide (e.g; CuO or $Cu_2O$), vanadium oxide (e.g.; $V_2O_3$ or $V_2O_5$), cobalt oxide (e.g.; CoO), iron oxide (e.g; $Fe_2O_3$ or $Fe_3O_4$), niobium oxide (e.g; $Nb_2O_5$), Indium Tin Oxide (ITO), Indium Zinc Oxide (IZO), Aluminum doped Zinc Oxide (ZAO), Aluminum Tin Oxide (TAO) or Antimony Tin Oxide (ATO).

The liquid crystal layer 250 may be a dynamic scattering mode liquid crystal layer that includes liquid crystals, dichroic dyes and ion materials. In case of a dynamic scattering mode, if a driving voltage is applied to the first electrode 230 and a common voltage is applied to the second electrode 240, the liquid crystals and the dichroic dyes are randomly moved by the ion materials. In this case, since light incident on the liquid crystal layer 250 may be scattered by the randomly moved liquid crystals or may be absorbed by the dichroic dyes, the light-shielding mode may be realized.

In more detail, the liquid crystal layer 250 may include liquid crystal cells 251, partition walls 252, a first alignment layer 253, and a second alignment layer 254. The liquid crystal cells 251 include liquid crystals 251a, dichroic dyes 251b and ion materials 251c. The liquid crystals 251a of a longitudinal-axis direction may be, but not limited to, positive liquid crystals arranged along a vertical direction (Z-axis direction) by the first and second alignment layers 253 and 254 even though no voltage is applied to the first and second electrodes 230 and 240. Likewise, the dichroic dyes 251b of a longitudinal-axis direction may be arranged along a vertical direction (Z-axis direction) by the first and second alignment layers 253 and 254 even though no voltage is applied to the first and second electrodes 230 and 240. Therefore, since the light controller 200 may be operated in the transmissive mode even though no voltage is applied, it is advantageous that the transmissive mode may be realized without power consumption.

The dichroic dyes 251b may be dyes that absorb light. For example, the dichroic dyes 251b may be black dyes that absorb every light of a visible ray wavelength range or dyes that absorb light except a specific colored (for example, red) wavelength and reflect light of the specific colored (for example, red) wavelength. In the description of the embodiment of the present invention, the dichroic dyes 251b may be, but not limited to, black dyes. For example, the dichroic dyes 251b may be dyes that have any one color of red, green, blue and yellow or have a mixed color of red, green, blue and yellow. That is, in the embodiment of the present invention, a rear background may be shielded while various colors are being displayed in the light-shielding mode. For this reason, since various colors may be provided in the light-shielding mode, a user may feel an esthetic effect. For example, the transparent display device according to the embodiment of the present invention may be used in a public place, and if the transparent display device is applied to a smart window or public window, which requires a transmissive mode and a light-shielding mode, the transparent display device may shield light while displaying various colors in accordance with time or place.

The ion materials 251c serves to allow the liquid crystals and the dichroic dyes to randomly move. The ion materials 251c may have predetermined polarities, whereby the ion materials 251c may move to the first electrode 230 or the second electrode 240 in accordance with a polarity of a voltage applied to each of the first electrode 230 and the second electrode 240. For example, in the case that the ion materials 251c have negative polarities, if a voltage of a positive polarity is applied to the first electrode 230 and a voltage of a negative polarity is applied to the second electrode 240, the ion materials 251c move to the first electrode 230. Also, in the case that the ion materials 251c have negative polarities, if a voltage of a positive polarity is applied to the second electrode 240 and a voltage of a negative polarity is applied to the first electrode 230, the ion materials 251*c* move to the second electrode 240. Also, in the case that the ion materials 251*c* have positive polarities, if a voltage of a positive polarity is applied to the first electrode 230 and a voltage of a negative polarity is applied to the second electrode 240, the ion materials 251*c* move to the second electrode 240. Also, in the case that the ion materials 251*c* have positive polarities, if a voltage of a positive polarity is applied to the second electrode 240 and a voltage of a negative polarity is applied to the first electrode 230, the ion materials 251*c* move to the first electrode 230. Therefore, if the voltage is applied to each of the first and second electrodes 230 and 240, the ion materials 251*c* repeat a movement moving from the first electrode 230 to the second electrode 240 and then returning to the first electrode 230, at a predetermined cycle. In this case, since the ion materials 251*c* collide with the liquid crystals 251*a* and the dichroic dyes 251*b* while moving, the liquid crystals 251*a* and the dichroic dyes 251*b* move randomly. The voltages applied to the first and second electrodes 230 and 240 may be alternating current voltages.

Alternatively, the ion materials 251*c* may give and take electrons in accordance with the polarities of the voltages applied to the first electrode 230 and the second electrode 240. Therefore, if an alternating current voltage having a predetermined cycle is applied to each of the first and second electrodes 230 and 240, the ion materials 251*c* give and take electrons at a predetermined cycle. In this case, since the electrons collide with the liquid crystals 251*a* and the dichroic dyes 251*b* while moving, the liquid crystals 251*a* and the dichroic dyes 251*b* move randomly. The voltages applied to the first and second electrodes 230 and 240 may be the alternating current voltages.

Since the liquid crystal cells 251 are in the liquid state, the partition walls 252 for maintaining a cell gap of the liquid crystal cells 251 are required. The partition walls 252 may be arranged on one surface of the first electrode 230 facing the second substrate 210. The partition walls 252 may be spaced apart from each other at a predetermined interval, and the liquid crystal cells 251 may be partitioned by the partition walls 252. Ratios of the liquid crystals 251*a* to the dichroic dyes 251*b* per liquid crystal cell 251 may be maintained almost similarly due to the partition walls 252.

The partition walls 252 are provided on one surface of the first electrode 230 facing the second electrode 240. The partition walls 252 are arranged to correspond to the control thin film transistor T1. The partition walls 252 are intended to partition the liquid crystal cells 251 and maintain a cell gap of the liquid crystal cells 251. Since the partition walls 252 are provided, if an external force is applied, the inside of the liquid crystal layer 250 may be protected. The partition walls 252 may be formed of a transparent material. In this case, the partition walls 252 may be formed of any one of, but not limited to, photo resist, photo-polymer and polydimethylsiloxane.

In the alternative, the partition walls 252 may include a material that may absorb light. For example, each of the partition walls 252 may be realized as a black partition wall. In this case, since the partition walls 252 may absorb light scattered by the liquid crystals 251*a* in the light-shielding mode, light-shielding efficiency of the light-shielding mode may be enhanced. Also, in the embodiment of the present invention, since the partition walls 252 are provided to correspond to the emission area EA of the display unit 100, transmittance in the transmissive mode is little lost even though each of the partition walls 252 is realized as the black partition wall.

In the alternative, the partition walls 252 may include scattering particles that may scatter light. The scattering particles may be beads or silica balls. In this case, since the partition walls 252 may again scatter light scattered by the liquid crystals 251*a* in the light-shielding mode, a long light path may be obtained. If a long light path is obtained, it is likely that light is to be absorbed by the dichroic dyes 251*b*, whereby light-shielding efficiency of the light-shielding mode may be enhanced.

Meanwhile, the partition walls 252 fail to actively pass through or shield light unlike the liquid crystal cells 251. That is, if the partition walls 252 are formed of a transparent material, the partition walls 252 pass through light but do not shield light. Also, if the partition walls 252 include a material that absorbs light or a material that scatters light, the partition walls 252 scatter or shield light but do not pass through light. Therefore, if the partition walls 252 are formed in an area corresponding to the transmissive area TA of the transparent display device, a problem occurs in that light leakage occurs in the partition walls 252 in the light-shielding mode to increase light transmittance or light is shielded in the partition walls 252 in the transmissive mode to lower light transmittance. Therefore, it is preferable that the partition walls 252 are arranged to correspond to the emission areas EA of the display unit 100 and the liquid crystal cells 251 are arranged to correspond to the transmissive areas TA of the display unit 100. The partition walls 252 may be arranged in, but not limited to, a stripe pattern. The partition walls 252 may be arranged in a honeycomb pattern or p (p is a positive integer of 3 or more)-angulated shape pattern.

The first alignment layer 253 is provided on the first electrode 230 and the partition walls 252, which face the second substrate 210. For example, the first alignment layer 253 may be, but not limited to, polyimide (PI).

The second alignment layer 254 is provided on one surface of the second electrode 240 facing the first substrate 110. The second alignment layer 254 may be polyimide (PI) that includes an adhesive material. In this case, the adhesive material may be, but not limited to, epoxy resin, polyolefin resin or acrylic resin.

Meanwhile, it is preferable that the second alignment layer 254 is formed thickly to enhance adhesion of the second alignment layer 254. Therefore, the thickness of the second alignment layer 254 may be thicker than that of the first alignment layer 253. However, if the second alignment layer 254 becomes thick, a problem occurs in that the voltage applied to the second electrode 240 should be enhanced to normally apply a vertical electric field to the liquid crystal layer 250. In the embodiment of the present invention, to lower the voltage applied to the second electrode 240, the second alignment layer 254 may be realized to include nano particles having a high dielectric constant. Silica nano particles, indium tin oxide (ITO) nano particles, or $TiO_2$ nano particles may be used as the nano particles. If the second alignment layer 254 includes nano particles, since a dielectric constant of the second alignment layer 254 may be enhanced, the vertical electric field may normally be applied to the liquid crystal layer 250 even though the voltage applied to the second electrode 240 is not enhanced.

The first and second alignment layers 253 and 254 may be, but not limited to, vertical alignment layers for aligning a longitudinal-axis direction of the liquid crystals 251*a* and the dichroic dyes 251b in a vertical direction (Z-axis direction) if no voltage is applied to the first and second electrodes 230 and 240.

Since an adhesive area of the first alignment layer 253 and the second alignment layer 254 becomes wide if areas of the partition walls 252 become wide, adhesion between the first alignment layer 253 and the second alignment layer 254 may be enhanced. If the second substrate 210 is a plastic film, it is difficult to attach the first and second substrates 110 and 210 to each other by using a separate adhesive. Therefore, it is preferable to widen an adhesive area of the partition wall 252 and the second alignment layer 254 to enhance adhesion between the first alignment layer 253 and the second alignment layer 254. However, since an area of the liquid crystal cells 251 becomes narrow if the areas of the partition walls 252 become wide, light-shielding efficiency of the light-shielding mode may be lowered. Therefore, the areas of the partition walls 252 may be set properly considering adhesion between the partition wall 252 and the second alignment layer 254 and light-shielding efficiency of the light-shielding mode.

In the aforementioned transparent display device according to the embodiment of the present invention, since the light controller 200 is provided on the first surface of the first substrate 110 and the display unit 100 is provided on the second surface of the first substrate 110, the bonding process may be omitted and one substrate may also be omitted as compared with the related art in which the light controller and the transparent display panel are respectively fabricated and then bonded to each other. Therefore, light transmittance in the transmissive mode of the transparent display device may be improved, and the fabricating cost may be reduced.

Also, in the transparent display device according to the embodiment of the present invention, the display thin film transistor T2 and the control thin film transistor T1 are provided at the position corresponding to the emission area EA, and the liquid crystal cells 251 are provided at the position corresponding to the transmissive area TA. Therefore, the transmissive area TA and the liquid crystal cells 251 may easily be aligned even without a separate alignment process as compared with the related art in which the light controller and the transparent display panel are respectively fabricated and then bonded to each other, whereby light transmittance in the transmissive mode may be prevented from being deteriorated.

Also, in the transparent display device according to the embodiment of the present invention, since the control thin film transistor T1 is provided in each of the emission areas EA, light may be controlled per transmissive area TA as compared with the related art in which the control thin film transistor T1 is not provided.

Figure 6:
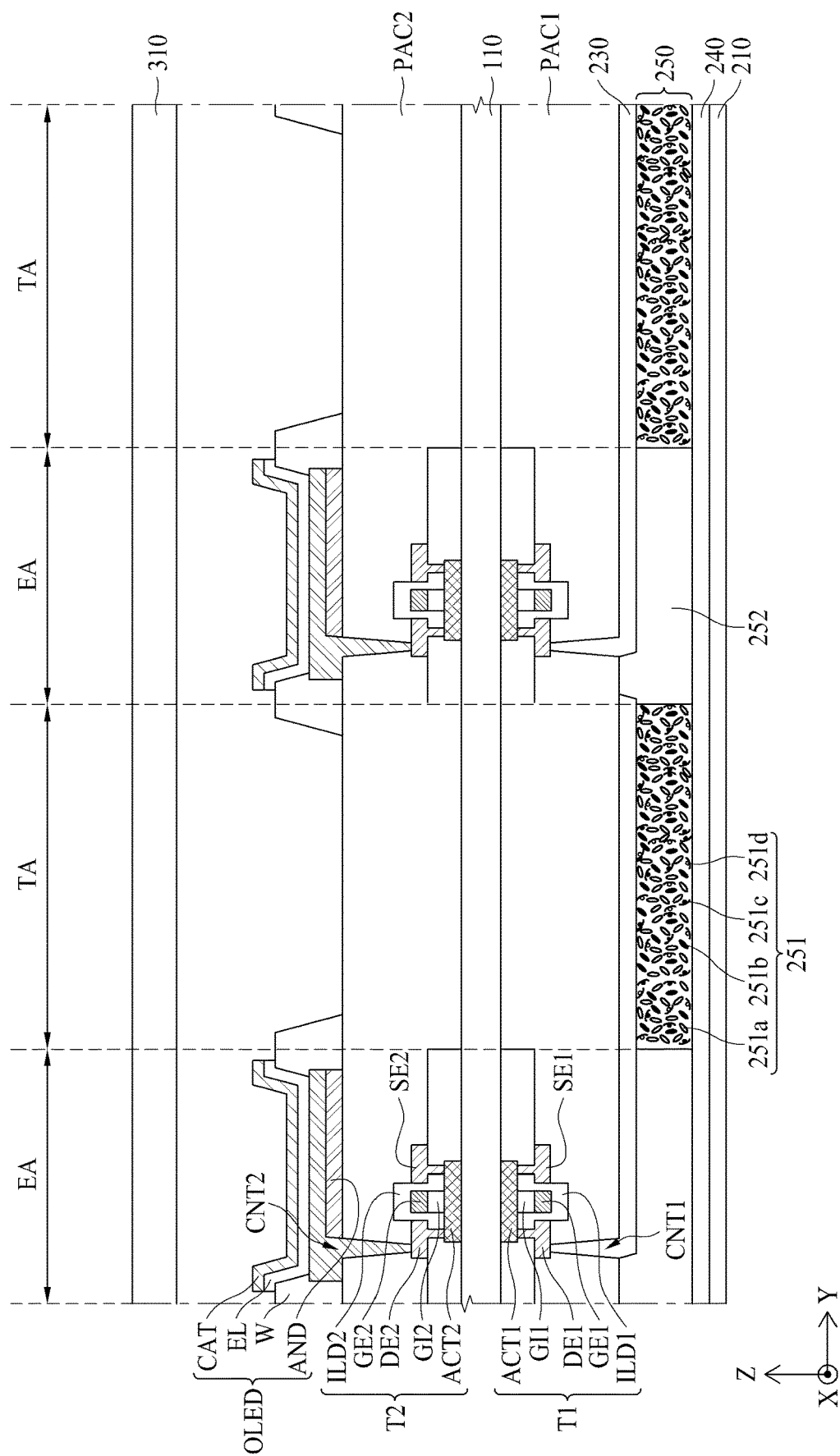
FIG. 6 is a cross-sectional view illustrating one side section of a transparent display device according to another embodiment of the present invention.

FIG. 6 is a cross-sectional view illustrating one side section of a transparent display device according to another embodiment of the present invention. The transparent display device according to another embodiment of the present invention is the same as that according to the aforementioned embodiment of the present invention except that the first and second alignment layers are omitted and the liquid crystal cells 251 further include vertical alignment materials 251d. Therefore, the vertical alignment materials 251d and their related elements will be described as follows, and repeated description of the other elements except the vertical alignment materials 251d and their related elements will be omitted or may be brief.

Referring to FIG. 6, the liquid crystal cells 251 according to another embodiment of the present invention further include the vertical alignment materials 251d. The vertical alignment materials 251d are the materials added to the liquid crystal cells 251 to align the liquid crystals 251a and the dichroic dyes 251b along a vertical direction. The vertical alignment materials 251d may be any one of, but not limited to, HTAB (hexadecyltrimethylammonium bromide), CTAB (cetyl trimethyl ammonium bromide), POSS (polyhedral oligomeric silsesquiloxane), dendronized polymer, dendrimer or their mixture. For example, if the vertical alignment materials 251d are HTAB or CTAB, HTAB or CTAB may be adhered to the first and second electrodes 230 and 240 and then aligned vertically like a surfactant, and the liquid crystals 251a and the dichroic dyes 251b may be aligned vertically by the vertically aligned HTAB or CTAB.

The vertical alignment materials 251d may be included in the liquid crystal cells 251 in the range of 0.01 wt % to 1 wt %. If the vertical alignment materials 251d are included in the liquid crystal cells 251 in the range less than 0.01 wt %, the liquid crystals 251a and the dichroic dyes 251b may not be aligned vertically. Also, if the vertical alignment materials 251d are included in the liquid crystal cells 251 in the range more than 1 wt %, the vertical alignment materials 251d may not be melted fully.

In the embodiment of the present invention, the vertical alignment materials 251d and the ion materials 251c are respectively included in the liquid crystal cells 251 as an example. However, the vertical alignment materials 251d and the ion materials 251c are not limited to the embodiment of the present invention. For example, the vertical alignment materials 251d may be mixed with the ion materials 251c. In this case, if the voltages are applied to the first and second electrodes 230 and 240, the liquid crystals 251a and the dichroic dyes 251b may be moved randomly by the ion materials. Also, if no voltage is applied to the first and second electrodes 230 and 240, the longitudinal-axis of the liquid crystals 251a and the dichroic dyes 251b may be arranged along a vertical direction (Z-axis direction) by the vertical alignment materials included in the ion materials.

The transparent display device according to another embodiment of the present invention may provide the same effect as that of the transparent display device according to the embodiment of the present invention described with reference to FIG. 5. In addition, in the transparent display device according to another embodiment of the present invention, since the liquid crystal cells 251 include the vertical alignment materials 251d, the liquid crystals 251a and the dichroic dyes 251b may be arranged along a vertical direction (Z-axis direction) in the transmissive mode even without the first and second alignment layers. Therefore, since the process of forming the first and second alignment layers is omitted, the fabricating cost of the transparent display device may be reduced.

FIG. 7 is a flow chart illustrating a method for fabricating a transparent display device according to an embodiment of the present invention. FIGS. 8A to 8F are cross-sectional views illustrating the method for fabricating the transparent display device of FIG. 7 according to the embodiment of the present invention. Hereinafter, the fabricating method of the transparent display device according to the embodiment will be described with reference to FIGS. 7 and 8A to 8F.

Figure 8A:
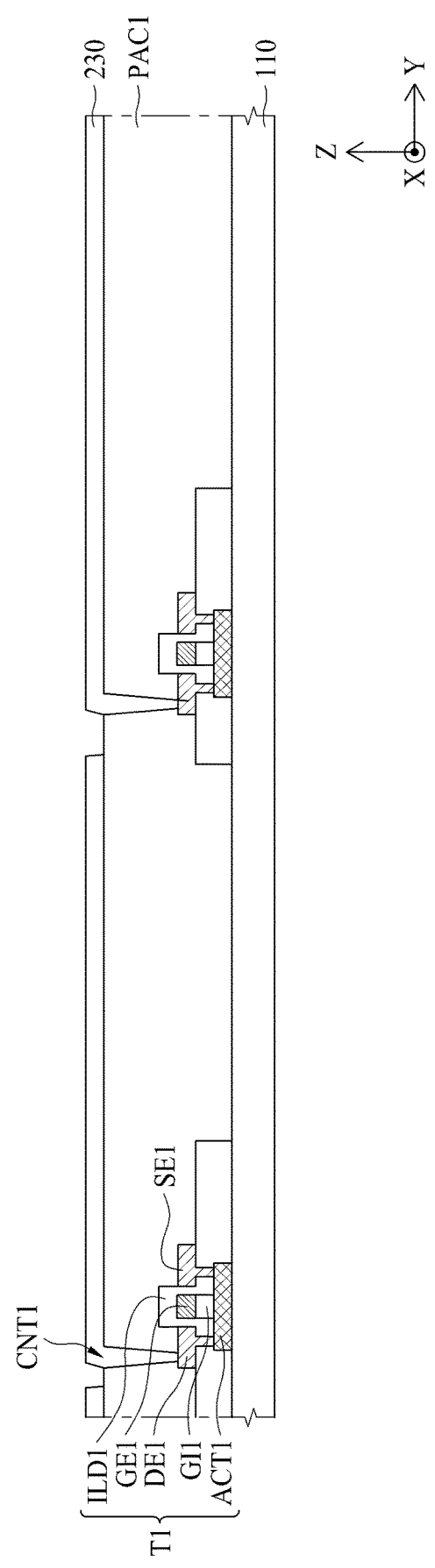
FIGS. 8A to 8F are cross-sectional views illustrating the method for fabricating a transparent display device of FIG. 7 according to the embodiment of the present invention.

First of all, as shown in FIG. 8A, the control thin film transistor T1 is formed on the first surface of the first substrate 110, and the first electrode 230 is formed to be connected with the control thin film transistor T1. (S101 of FIG. 7)

Figure 8B:
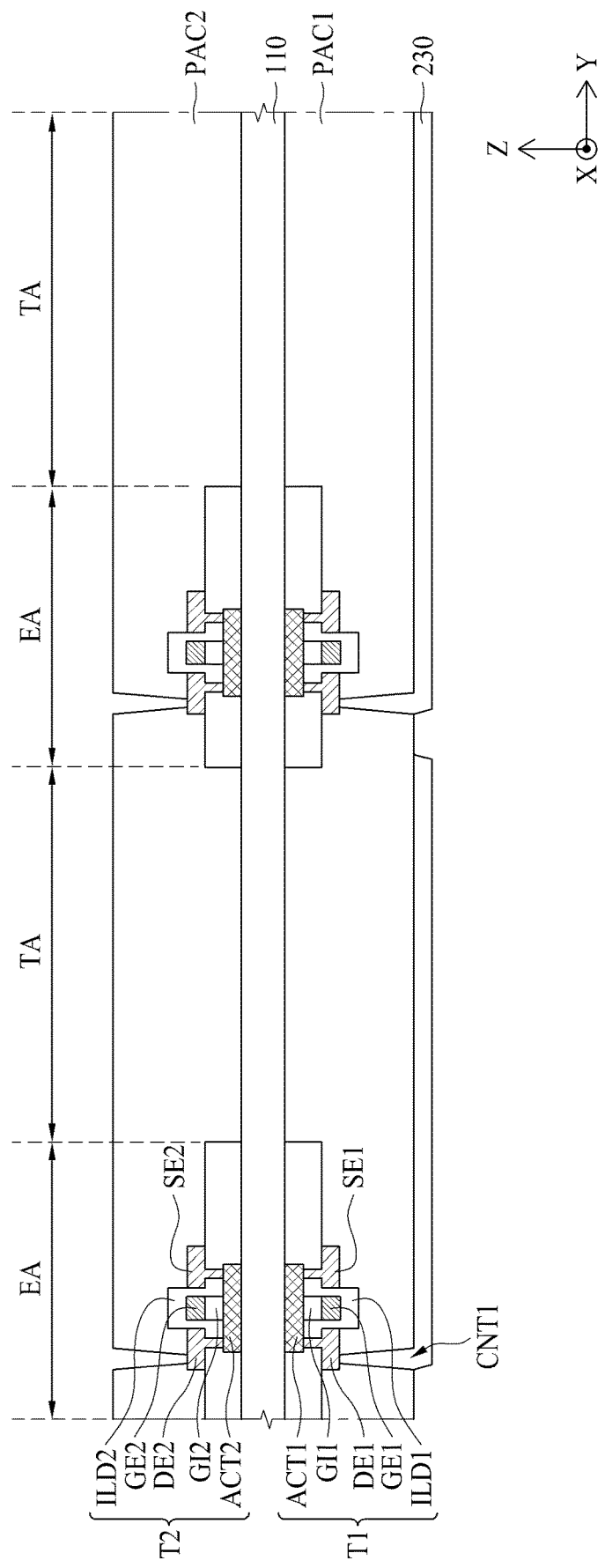

Secondly, as shown in FIG. 8B, the display thin film transistor T2 is formed on the second surface of the first substrate 110, which opposite to the first surface of the first substrate 110. In this case, the display thin film transistor T2 is formed at the position corresponding to the control thin film transistor T1. (S102 of FIG. 7)

Figure 8C:
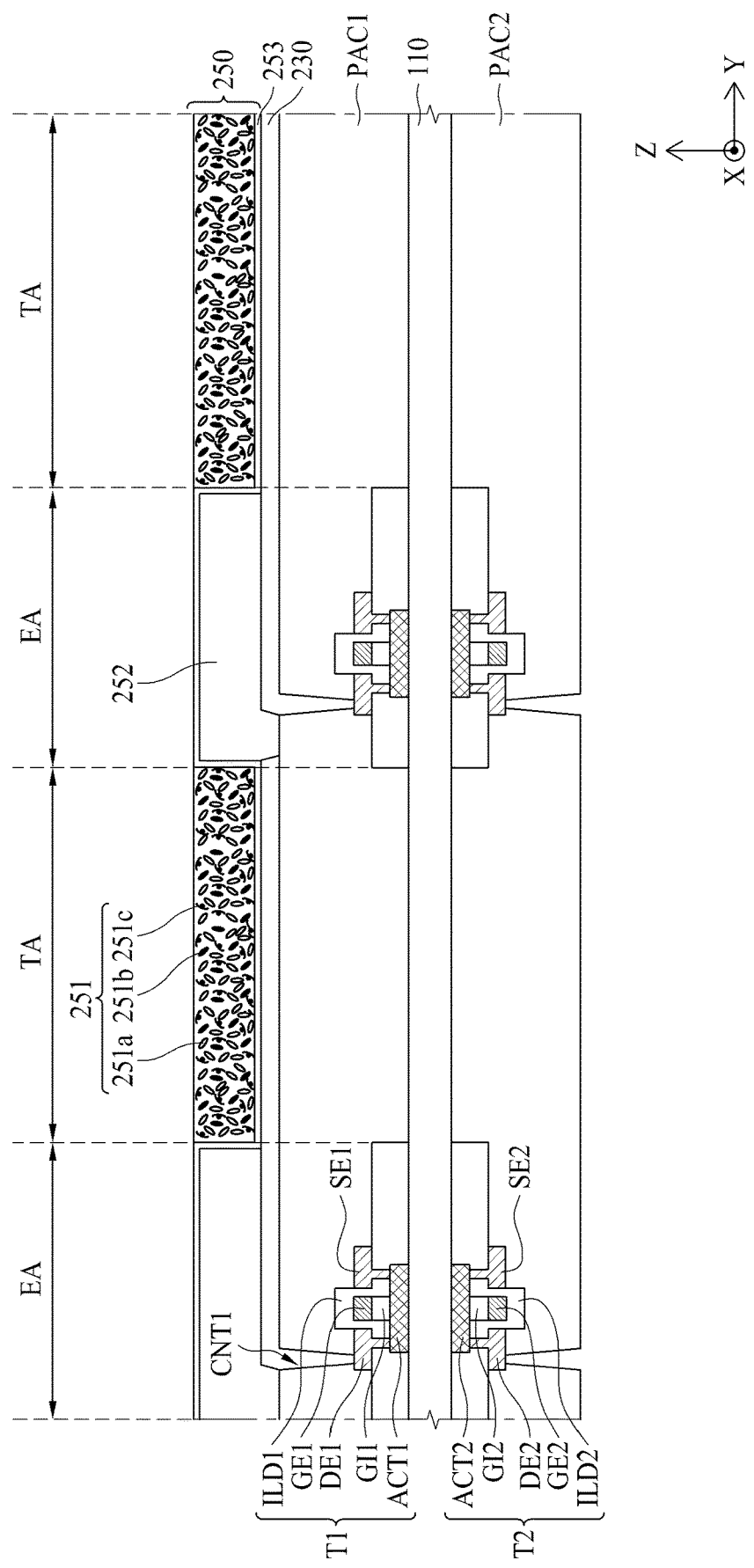

Thirdly, as shown in FIG. 8C, the liquid crystal cells 251 and the partition walls 252 for maintaining the cell gap of the liquid crystal cells 251 are formed on the first electrode 230. The partition walls 252 are formed at the position corresponding to the control thin film transistor T1. The partition walls 252 may be formed by an imprinting method or photo lithography method.

If the partition walls 252 are formed by the imprinting method, the partition walls 252 may be formed in such a manner that a material for forming the partition walls 252 is deposited on one surface of the first electrode 230 and then pressurized by a mold comprised of silicon, quartz, or polymer material. In this case, since it is preferable that the partition walls 252 are arranged to correspond to the emission areas EA of the display unit 100, a width of the partition walls 252 is preferably formed to be less than that of the emission areas EA.

If the partition walls 252 are formed by the photo lithography method, the partition walls 252 may be formed in such a manner that a material for forming the partition walls 252 is deposited on one surface of the first electrode 230 and then exposed using a photo process. In this case, the first alignment layer 253 may be formed on the first electrode 230 and the partition walls 252.

The liquid crystal cells 251 may be formed by filling a liquid crystal material in the areas partitioned by the partition walls 252. The process of filling a liquid crystal material in the areas partitioned by the partition walls 252 may be performed by an inkjet method. The liquid crystal material may include the liquid crystals 251a, the dichroic dyes 251b, and the ion materials 251c. (S103 of FIG. 7)

Figure 8D:
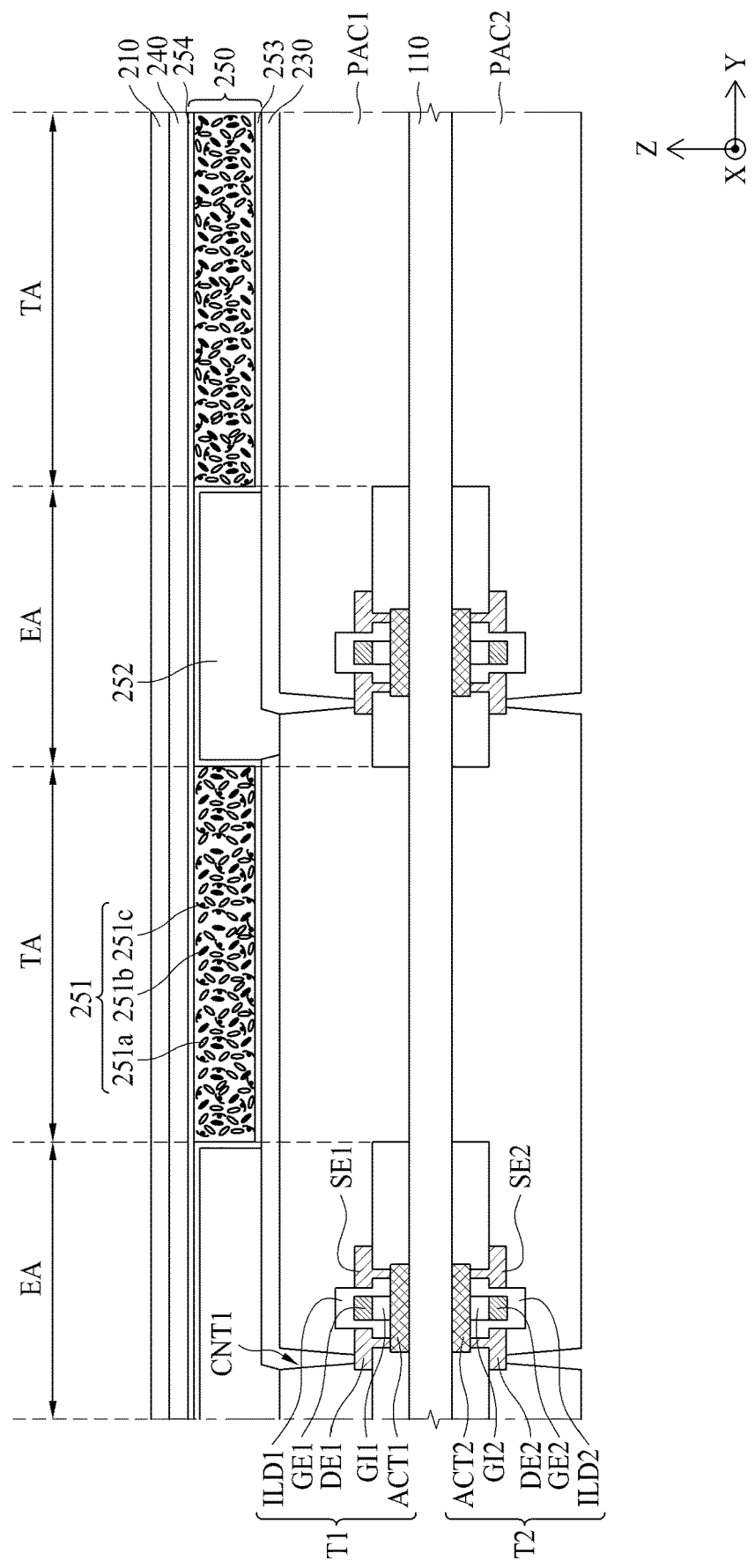

Fourthly, as shown in FIG. 8D, the second substrate 210 is attached onto the liquid crystal cells 251 and the partition walls 252. The second electrode 240 may be formed on one surface of the second substrate 210 facing the first electrode 230, and the second alignment layer 254 may be formed on the second electrode 240. The first alignment layer 253 provided in the first substrate 110 and the second alignment layer 254 provided in the second substrate 210 may be bonded to each other, whereby the second substrate 210 may be attached to the first substrate 110. (S104 of FIG. 7)

Figure 8E:
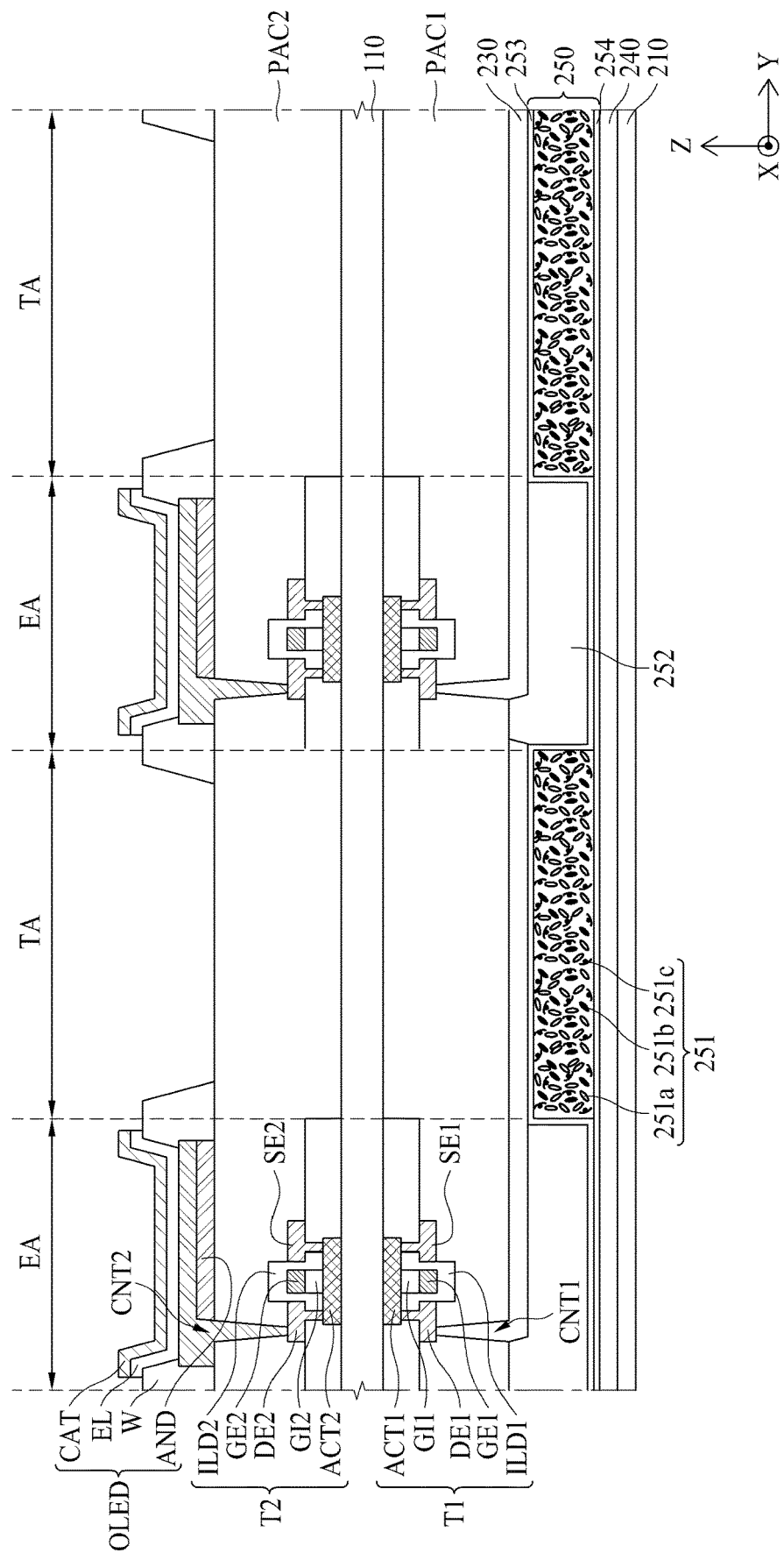

Fifthly, as shown in FIG. 8E, the organic light emitting diode OLED is formed on the display thin film transistor T2. The organic light emitting diode OLED includes the anode electrode AND, the organic layer EL, and the cathode electrode CAT. (S105 of FIG. 7)

Figure 8F:
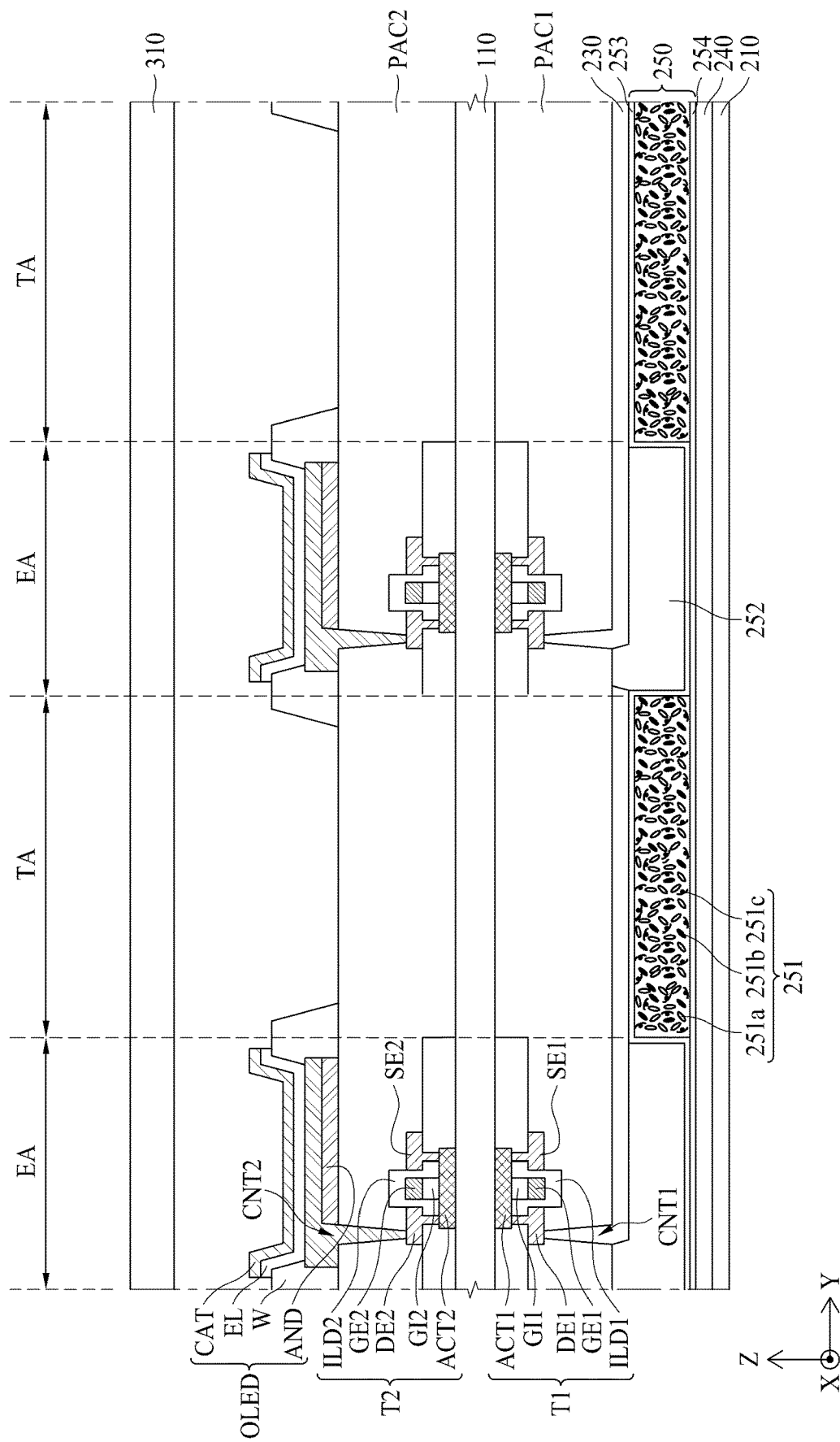

Finally, as shown in FIG. 8F, the third substrate 310 is attached onto the organic light emitting diode OLED. The third substrate 310 may be an encapsulation substrate, and may be attached to the first substrate 110 by using a sealant, etc. (S106 of FIG. 7)

In the transparent display device according to the embodiment of the present invention, the display thin film transistor T2 and the control thin film transistor T1 are provided in the position corresponding to the emission area, and the liquid crystal cells 251 are provided in the position corresponding to the transmissive area TA. Therefore, the transmissive area TA and the liquid crystal cells 251 may easily be aligned even without a separate alignment process as compared with the related art in which the light controller and the transparent display panel are respectively fabricated and then bonded to each other, whereby light transmittance in the transmissive mode may be prevented from being deteriorated.

Also, in the transparent display device according to the embodiment of the present invention, since the control thin film transistor T1 is provided in each of the emission areas EA, light may be controlled per transmissive area TA as compared with the related art in which the control thin film transistor T1 is not provided.

As described above, according to the embodiments of the present invention, the following advantages may be obtained.

In the transparent display device according to the embodiment(s) of the present invention, since the light controller is provided on the first surface of the first substrate and the display unit is provided on the second surface of the first substrate, the bonding process may be omitted and one substrate may be omitted as compared with the related art in which the light controller and the transparent display panel are respectively fabricated and then bonded to each other. Therefore, the fabricating cost may be reduced.

Also, in the transparent display device according to the embodiment(s) of the present invention, the display thin film transistor and the control thin film transistor are provided in the position corresponding to the emission area, and the liquid crystal cells are provided in the position corresponding to the transmissive area. Therefore, the transmissive area and the liquid crystal cells may easily be aligned even without a separate alignment process as compared with the related art in which the light controller and the transparent display panel are respectively fabricated and then bonded to each other, whereby light transmittance in the transmissive mode may be prevented from being deteriorated.

Also, in the transparent display device according to the embodiment(s) of the present invention, since the control thin film transistor is provided in each of the emission areas, light may be controlled per transmissive area as compared with the related art in which the control thin film transistor is not provided.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A transparent display device comprising:
   a first substrate, a second substrate facing a first surface of the first substrate, and a third substrate facing a second surface of the first substrate;
   a display unit arranged between the first and third substrates, and including a transmissive area and an emission area; and
   a light controller arranged between the first and second substrates, and transmitting or shielding incident light,
   wherein the display unit includes:
      a display thin film transistor provided on the second surface of the first substrate; and
      an organic light emitting diode provided on the display thin film transistor, wherein the light controller includes:
      a control thin film transistor provided on the first surface of the first substrate;
      a first electrode provided on the control thin film transistor;
      a second electrode provided on one surface of the second substrate facing the first substrate;

liquid crystal cells arranged to correspond to the transmissive area between the first electrode and the second electrode; and partition walls for partitioning the liquid crystal cells and arranged between the liquid crystal cells, wherein the display thin film transistor, the control thin film transistor and the partition walls are arranged to correspond to the emission area, wherein the first electrode is disposed in the transmissive area and the emission area that are adjacent to each other so that the first electrode extends from the control thin film transistor to an edge of an adjacent partition wall in an adjacent emission area, and wherein the partition walls are only in the emission area, and the liquid crystal cells are only in the transmissive area.

2. The transparent display device of claim 1, further comprising:
- a first alignment layer provided on the first electrode and the partition walls; and
- a second alignment layer provided on one surface of the second electrode facing the first electrode.

3. The transparent display device of claim 2, wherein the second alignment layer includes nano particles.

4. The transparent display device of claim 1, wherein each of the liquid crystal cells includes liquid crystals and dichroic dyes for absorbing light.

5. The transparent display device of claim 4, wherein each of the liquid crystal cells further includes ion materials for moving the liquid crystals and the dichroic dyes if voltages are applied to the first electrode and the second electrode as alternating current voltages.

6. The transparent display device of claim 4, wherein each of the liquid crystal cells further includes a vertical alignment material.

7. The transparent display device of claim 1, wherein the light controller is disposed on the first surface of the first substrate and the display unit is disposed on the second surface of the first substrate.

8. The transparent display device of claim 1, wherein the partition walls include a material that absorb light or include scattering particles that scatter light.

9. The transparent display device of claim 6, wherein the vertical alignment material is included in the liquid crystal cells in a range of 0.01 wt % to 1 wt %.

10. A method for fabricating a transparent display device, the method comprising:
- defining a transmissive area and an emission area at a first substrate;
- forming a control thin film transistor and a first electrode, which is connected to the control thin film transistor, at the emission area on a first surface of the first substrate;
- forming a display thin film transistor at the emission area on a second surface opposite to the first surface of the first substrate;
- forming liquid crystal cells corresponding to the transmissive area, and partition walls corresponding to the emission area for maintaining a cell gap of the liquid crystal cells on the first electrode;
- attaching a second substrate, on which a second electrode is formed, onto the liquid crystal cells and the partition walls;
- forming an organic light emitting diode on the display thin film transistor; and
- attaching a third substrate onto the organic light emitting diode, wherein the first electrode is disposed in the transmissive area and the emission area that are adjacent to each other so that the first electrode extends from the control thin film transistor to an edge of an adjacent partition wall in an adjacent emission area, and wherein the partition walls are only in the emission area, and the liquid crystal cells are only in the transmissive area.

* * * * *